United States Patent [19]

Calandrino

[11] 4,381,514

[45] Apr. 26, 1983

[54] TRANSVERSE MODE CONVERTER FOR USE WITH A LONGITUDINAL MODE OSCILLOGRAPHIC RECORDER

[76] Inventor: Peter M. Calandrino, 2114 McGowan Pkwy., Marysville, Calif. 95901

[21] Appl. No.: 252,397

[22] Filed: Apr. 9, 1981

[51] Int. Cl.³ ............................................... G01D 9/42
[52] U.S. Cl. .................................... 346/110 R; 346/23
[58] Field of Search ............................... 346/110 R, 23

[56] References Cited
U.S. PATENT DOCUMENTS 3,404,309 10/1968 Massell et al. ................... 346/23 X
3,434,158 3/1969 Stauffer et al. .................... 346/23 X
3,761,947 9/1973 Volkmann et al. ................ 346/23 X

*Primary Examiner*—Donald A. Griffin
*Attorney, Agent, or Firm*—Lothrop & West

[57] ABSTRACT

A converter for adapting a longitudinal mode, fiber optics cathode ray tube recorder, or visicorder, to operate selectively in either the longitudinal, Y axis mode or in the transverse, X/Z axes mode. The data to be recorded is displayed, initially, upon a control oscilloscope. Samples of the horizontal sweep and gate signals of the control oscilloscope are directed to the converter. Therein, the horizontal sweep signal is conditioned and amplified to provide the high current linear ramp signal necessary to drive the horizontal yoke of the visicorder. The data is synchronized with the gate signal to ensure identity between the visual display on the control oscilloscope and the data recorded by the visicorder. The converter also includes circuitry for selectively printing start and end of trace markers, a time line marker, and external time code data in association with the recorded data, to facilitate its subsequent analysis and identification.

12 Claims, 6 Drawing Figures

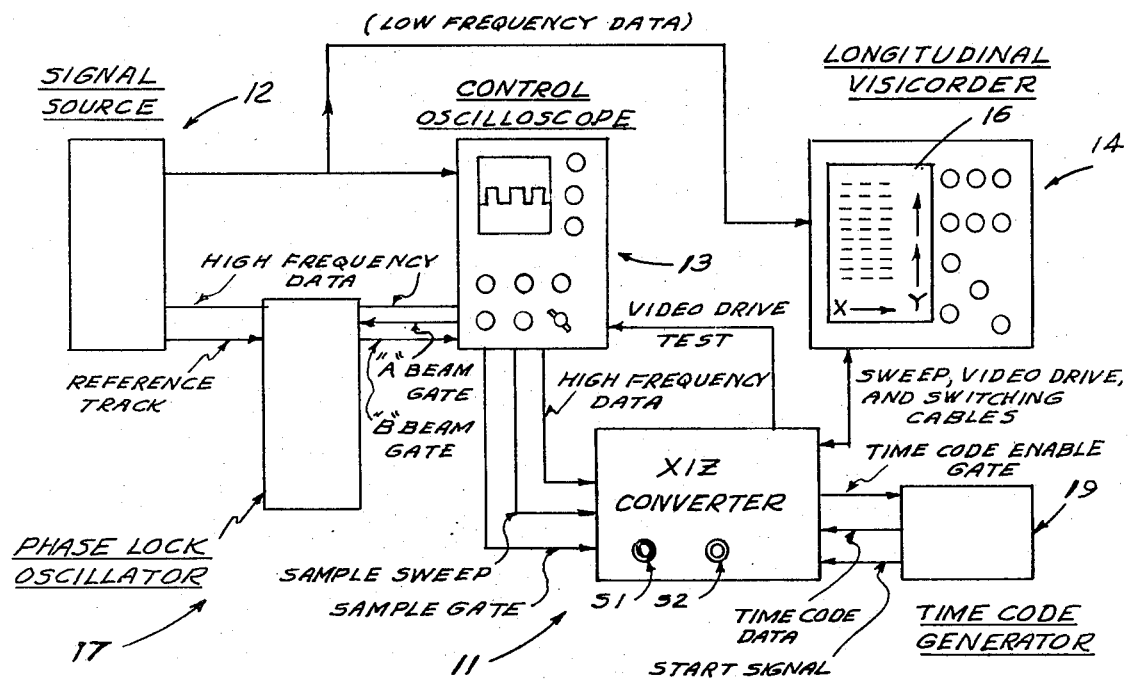
FIG. 1
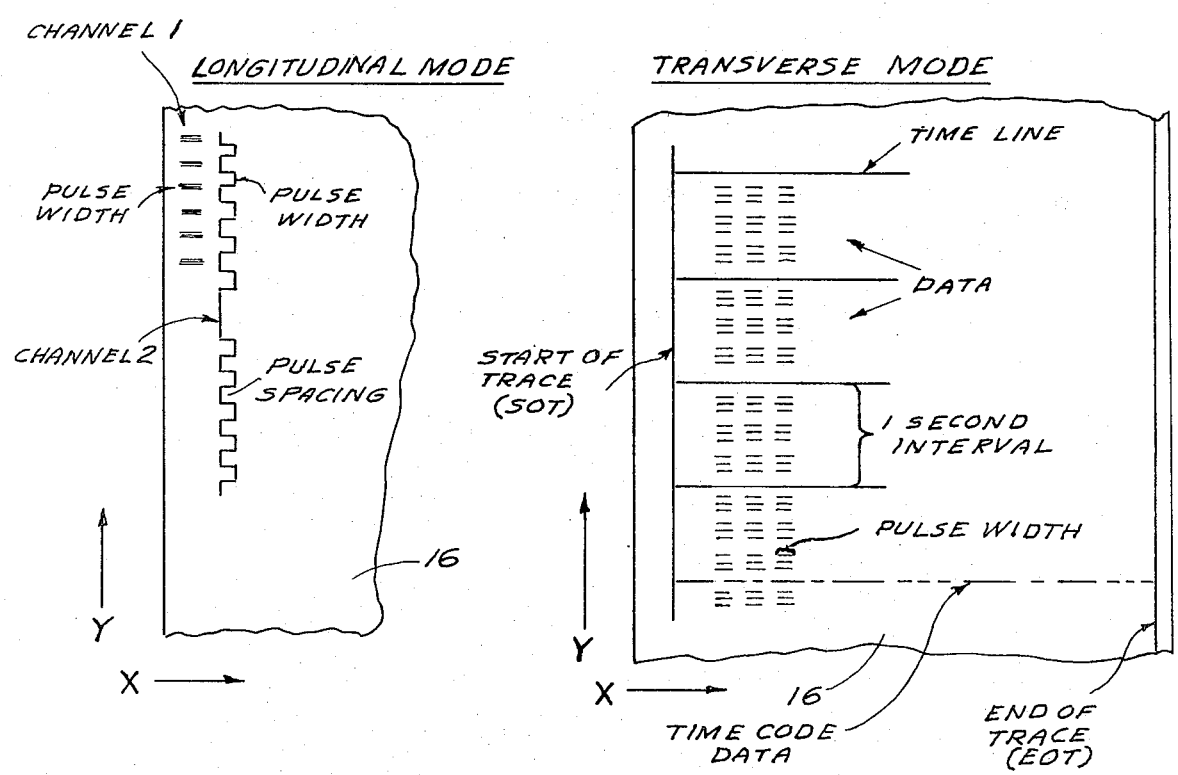
FIG. 2
FIG. 3

TRANSVERSE MODE CONVERTER FOR USE WITH A LONGITUDINAL MODE OSCILLOGRAPHIC RECORDER

BACKGROUND OF THE INVENTION

1. Field of the Invention

The invention relates generally to an external adapter for use with a longitudinal mode oscillographic recorder, or visicorder, as such device is sometimes designated, to expand its capabilities for recording visual traces corresponding to an incoming electrical signal. More specifically, the invention allows a longitudinal mode visicorder, designed for recording longitudinally a plurality of channels containing low frequency data to record transversely a single channel of high frequency data. Previously, two separate visicorders, one designed to operate in the longitudinal mode and the other to operate in the transverse mode, were required to make permanent visual records of both low and high frequency electrical signals.

Switching circuitry in the adapter permits the operator to select instantly either the longitudinal or transverse recording mode for the longitudinal visicorder.

The adapter also includes circuitry to record a time line reference, sweep start and sweep end indicators, and external time code data upon the visicorder graph, facilitating analysis of the recorded data.

2. Description of the Prior Art

Exemplary of a transverse, or X/Z mode oscillographic recorder is the apparatus disclosed in U.S. Pat. No. 3,434,158, issued to Stauffer et al. This patent discloses an electro-mechanical means by which a radiation emitting cathode ray tube, containing fiber optic bundles, can be driven to impress a permanent visual record of high frequency data upon a radiation sensitive recording medium. The recording medium is drawn vertically and longitudinally over the face of the cathode ray tube, while the electron beam of the cathode ray tube is driven primarily transverse to the travel of the recording medium. A single channel of incoming data is thereby recorded in parallel groups of horizontal traces (X-axis data) across the radiation sensitive medium. Variations in the intensity of the horizontal traces are known as Z-axis data, while longitudinal deviations of the traces are called Y axis data. However, owing to limited recording bandwidth of this device in the Y axis, records of high frequency data are generally recorded solely in the X and Z axes.

The Stauffer device includes a small built in monitor oscilloscope, providing immediate viewing of the input signal. However, this internal oscilloscope lacks the visual resolution and technical features necessary for proper adjustment of the oscillographic recorder's drive and control circuitry. Consequently, time consuming trial and error recording runs and adjustments are often necessary to obtain a usable record of the data stream. While this device will record a single channel of high frequency data, it does not include circuitry for isolating selective portions of the data stream for detailed analysis. These deficiencies can be overcome to some extent through the use of a larger and more sophisticated external oscilloscope, interconnected to the Stauffer visicorder in such a way as to provide control signals which synchronize the video representation of the oscilloscope with the images recorded on the visicorder. Nevertheless, even with the versatility provided by an external oscilloscope, the Stauffer visicorder cannot record multi-channel low frequency data, which is best suited for longitudinal, or Y axis mode recordation.

A plurality of simultaneously occurring low frequency signals can readily be recorded through the use of a longitudinal mode visicorder, such as the Honeywell Model 1858. This unit will record longitudinally, up to eighteen channels of time-coincident signals as parallel groups of vertical lineations along the recording medium.

However, for several reasons, the longitudinal mode visicorder is unusable to record even a single channel of high frequency data. Since the data are recorded in parallel, longitudinal channels, the longitudinal resolution of the recorded data is limited ultimately by the "pull rate", or longitudinal speed of the recording medium. Assuming that the data of interest includes pulse information, as the duration of the pulses decreases, the pull rate must increase commensurately to ensure adequate resolution of the recorded data. At pulse widths of $100\mu$ seconds or less, the longitudinal recorder becomes impractical to use unless the recording medium is drawn very quickly across the face of the tube, thereby consuming a considerable amount of the expensive recording medium. However, at some point, the mechanical drive for the recording medium can no longer provide the additional speed for expanding resolution in the longitudinal axis, and adjacent longitudinal traces begin to merge.

The multi-channel recording capabilities of current longitudinal visicorders necessitate that time-share sampling methods be employed in the video drive circuitry for the fiber optics cathode ray tube. In other words, the incoming information for each channel is sampled for only a fraction of real time to determine signal presence and amplitude. For low frequency signals, the sampling rate is such that an entirely adequate representation of the information is recorded despite the fact that it is based upon time-fractional sampling methods. As the frequency of the data increases, however, information is lost during the period when other channels are being sampled, and the data as recorded are therefore incomplete.

Owing to the resolution limitations imposed by longitudinally recording data traces upon the recording medium, and the informational inaccuracy inherent in the time-sharing sampling methods, the longitudinal oscillographic recorder, or visicorder, is unable to make accurate records of high frequency data. As a consequence, to make permanent visual records of both multi-channel low frequency data as well as a single channel of high frequency data, two separate visicorders, one operating in the longitudinal mode and one operating in the transverse mode, have heretofore been required.

SUMMARY OF THE INVENTION

The present invention is designed to convert a longitudinal, or Y axis oscillographic recorder, or visicorder, to operate in the transverse, or X/Z mode, providing an accurate, high resolution, visual record of a single channel of high frequency data. In preparation, a dual trace control oscilloscope, preferably having delayed sweep and gate capabilities, is interposed between the data source and the transverse mode converter as described herein. The incoming data signal is fed into the control oscilloscope, and its delayed horizontal sweep and gate are adjusted to display precisely any selected portion of the incoming signal.

Samples of the delayed horizontal sweep and gate signals of the control oscilloscope are delivered to the X/Z mode converter. The horizontal sweep signal is conditioned and amplified by the converter to satisfy the requirements for driving the electron beam of the cathode ray tube of the longitudinal visicorder, transversely. The existing horizontal drive circuitry of the visicorder is temporarily disabled, and the now-modified horizontal sweep of the control oscilloscope is interconnected to drive the horizontal yoke of the visicorder's cathode ray tube.

The high frequency signal is also fed to the data input of the converter, and therein is synchronized with the gate pulses of the control oscilloscope. The gating synchronization ensures that the video output of the X/Z mode converter matches precisely the visual representation of the control oscilloscope. The normal video drive circuitry of the longitudinal visicorder is also temporarily disabled, leaving the electron beam control element of the cathode ray tube to be driven solely by the amplified video output of the converter.

Convenient marking generators within the converter are selectively actuated to impress a permanent record of pertinent time reference information directly upon the recording medium and in close association with the recorded data traces. The time reference marks are very useful for subsequent identification and analysis of the data. When desired, a time line marker records a horizontal line across the recording medium at one second intervals, making a later determination of chart "pull rate" a simple matter. Start of trace (SOT) and end of trace (EOT) markers provide an exact indication of the end extremities of the horizontal sweep. Lastly, external encoded information can be selectively entered upon a single transverse pass of the horizontal sweep, allowing any code of pulse data to convey, for example, the time of recordation and the identify of the data.

The converter further includes switching circuitry and appropriate interconnecting cables to effect instant restoration of longitudinal mode operation of the oscillographic recorder. In other words, the operator can operate the longitudinal oscillographic recorder in either the longitudinal or the transverse modes at the flip of a switch located on the control panel of the converter.

BRIEF DESCRIPTION OF THE DRAWINGS

FIG. 1 is a block diagram of a data analysis system, incorporating the transverse mode converter in combination with a longitudinal mode oscillographic recorder capable of making permanent visual records of both low and high frequency data;

FIG. 2 represents a typical record of two simultaneously occurring channels of low frequency data as produced by a Y axis, or longitudinal oscillographic recorder operating in its normal, longitudinal mode;

FIG. 3 represents a typical record of a single channel of high frequency data as produced by a longitudinal oscillographic recorder operating in the alternate X/Z, or transverse mode by activating the converter;

DETAILED DESCRIPTION OF THE PREFERRED EMBODIMENT

Figure 4:
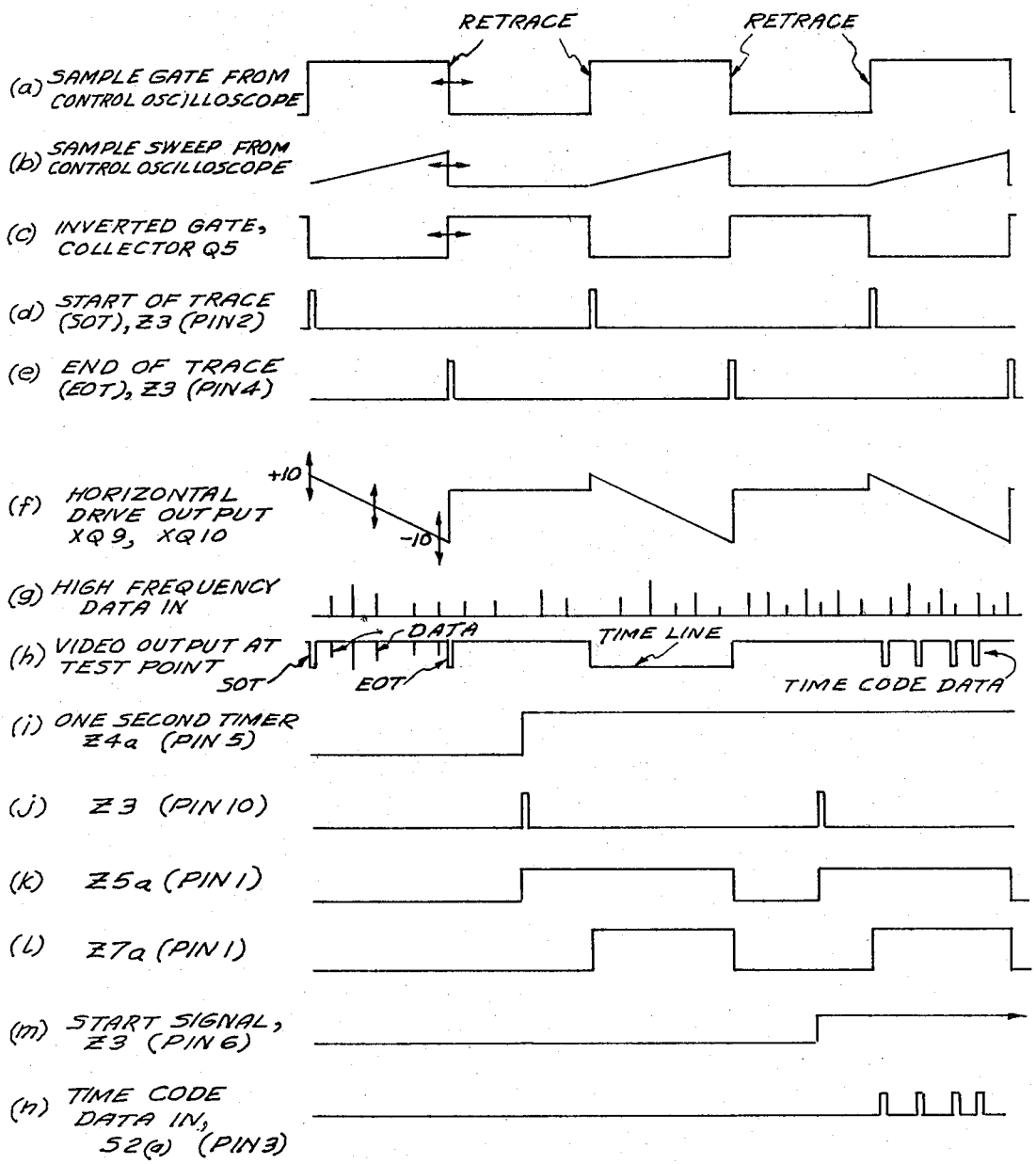
FIG. 4 illustrates a timing diagram for sweep, gating synchronization, video drive, and marking generator signals within the converter.

The transverse mode converter of the invention is generally designated by the numeral 11, and is shown as an integral component of the low and high frequency data analysis system illustrated in FIG. 1. A signal source 12 may be provided by a live source such as a spectrum analyzer, a radar or sonar detector, a seismology transducer, or the like. On the other hand, the signal source 12 could also be a recorded source such as a tape recorder having an extremely wide frequency response and capable of accurately reproducing the electrial signals corresponding to the subject data. If low frequency data is to be analyzed, a portion of the signal may initially be fed to the control oscilloscope 13 for immediate observation. The low frequency data is also fed directly through a branch line into the longitudinal mode oscillographic recorder 14, or visicorder, for recording a permanent visual record of the data upon the recording medium 16.

While the procedure just outlined describes a method for recording a single channel of low frequency data, a plurality of simultaneously occurring signals can also be recorded in a similar manner. The longitudinal visicorder 14 would typically include input and channel sampling circuitry to allow the recordation of multiple data channels produced by the signal source 12.

Making specific reference to FIG. 2, a graphic depiction of a multi-channel recording made by a longitudinal visicorder is shown. The recording medium 16 is pulled in a Y axis, or longitudinal direction, and different aspects of the data contained in the indicated channel 1 and channel 2 are recorded both in an X axis, or transverse fashion and in a Y axis, or longitudinal fashion upon the recording medium 16. Being recorded in the longitudinal mode of operation in this instance, the X axis represents the relative amplitude and the Y axis represents the relative duration, of each pulse. The Y axis also illustrates the spacing, or pauses, between adjacent pulses or groupings of pulses. The pull rate and video scanning parameters affect the recorded appearance of the recorded data, but with consideration given to appropriate compensating factors, one skilled in the art can make an accurate determination of data attributes directly from the recorded graph.

While the longitudinal mode of recordation works well for low frequency data such as that contained in Channel 2, it will be appreciated that the higher frequency data contained in Channel 1 challenges the resolution capabilities of the longitudinal visicorder (see FIG. 2). While the X axis appears to reproduce faithfully the amplitude of the Channel 1 pulses, the lack of resolution in the Y axis information (pulse width and pulse spacing) makes analysis difficult. And it is precisely this Y axis pulse information which is often of greatest interest to the analyst, rather than X axis information relating to pulse amplitude, as recorded in the longitudinal mode.

By increasing the pull rate of the recording medium, the limits of Y axis resolution can be extended somewhat. However, a rapid pull rate not only wastes an inordinate amount of recording medium, but also induces recording inaccuracies during the prolonged and non-linear "start-up" period. Notwithstanding increased pull rates, as the data frequency is raised further, a practical upper frequency limit is reached where the longitudinal visicorder recording in its normal, longitudinal mode can no longer reproduce records having usable Y axis resolution.

Posing an additional limitation, longitudinal visicorders having multi-channel capabilities generally employ a "time sharing" circuit for sampling the incoming data signals, permitting the single cathode ray tube to impress up to 18 physically distinct channels of data during each transverse sweep. At lower frequencies, the rate of sampling is relatively high when compared to the frequency of the data. In other words, each incoming pulse will likely be sampled a number of times to ensure than an accurate representation of its amplitude, duration, and temporal placement is recorded. However, high frequency pulses are so brief that individual pulses or groups of pulses can be missed while the sampling circuit is scanning the other channels for incoming data. Consequently, the recorded data does not necessarily reflect the entirety of the actual data presented at each input channel of the visicorder.

Returning now to FIG. 1 and assuming in the first instance that the signal source 12 is a tape recorder, or the like, a high frequency signal and its companion reference track are produced at its output terminals. A phase lock oscillator 17, or synthesizer, is interposed between the signal source 12 and the dual trace control oscilloscope 13, preferably having delay sweep and gate capabilities. The phase lock oscillator 17, of conventional design, compares the signal generated by its internal oscillator with the incoming reference track. If time base instabilities are detected, an "A" beam gate signal from the oscilloscope 13 is appropriately corrected and is now called the "B" beam gate signal. The time base corrected "B" beam gate signal is then sent back to the control oscilloscope 13 to determine gating for the data actually displayed for the operator by the "B" beam. Once the sweep rate of the control oscilloscope 13 is properly adjusted to display the data, the processed "B" beam gate signal will ensure than sweep initiation will change accordingly if time base anomalies in the reference track are detected by the phase lock oscillator 17. In this manner, the visual readout of the data on the control oscilloscope 13 will remain stable regardless of perturbations either in the recorded material or with the playback recorder. The apparatus and process associated with effecting time base corrections for a recording/playback system are varied and well known in the art, and to that end, only this brief discussion is offered.

If the signal source 12 is a live source, a direct interconnection would merely be made between the source 12 and the control oscilloscope 13, and the occurrence of the detected event and its display upon the oscilloscope 13 would then be simultaneous.

The ability to focus attention upon a selected portion of the stream of data is extremely important for the operator, or data analyst, since it is often only a small pattern or relationship between adjacent pulses which contains the information of interest. As mentioned, the control oscilloscope 13 preferably includes dual trace as well as delay sweep and gate provisions. Once the data is initially displayed upon the first trace, the second trace in combination with the delay sweep and gate feature can be used to display a particular, selected portion of the incoming data. In this manner, the data analyst is able to preview and screen the data, so that the subsequent recording will present solely the portion of interest.

The oscilloscope's signal sampling circuitry offers an additional benefit in that high frequency signals are accurately displayed. The data analyst has previously adjusted the horizontal sweep rate of the control oscilloscope to match the frequency of the incoming data. During each sweep of the horizontal beam, the data is continuously sampled and amplified to drive the oscilloscope's cathode ray tube. In contrast to the time sharing sampling technique used with the longitudinal visicorder, the oscilloscope's continuous data sampling method assures accordance between the incoming data and its visual representation displayed upon the control oscilloscope. Since operation of the transverse mode converter is determined by selected output signals of the control oscilloscope, the importance of the oscilloscope's data sampling method will become more evident herein.

Available outputs from the control oscilloscope includes samples of the horizontal sweep and gating signals. Since the control oscilloscope 13 preferably has dual trace capabilities, it would normally include two pairs of sample output signals, each pair including horizontal sweep and gating signals corresponding to a respective displayed trace. However, only the delayed sweep and gating output signals associated with the oscilloscope trace displaying the portion of the data to be recorded are of direct concern. Therefore, all further reference herein to sweep and gating signals will be to the delayed sweep and gating signals (see FIGS. 1 and 4). The gating signal assumes a characteristic square wave, is triggered by the incoming data, and is synchronous with the sawtooth waveform of the horizontal sweep signal. In a manner to be discussed at considerable length herein, the invention 11 synchronizes the data with the sample gate and conditions the sample sweep to provide video and high current sweep signals which will properly operate the longitudinal visicorder in the transverse mode.

Figure 5:
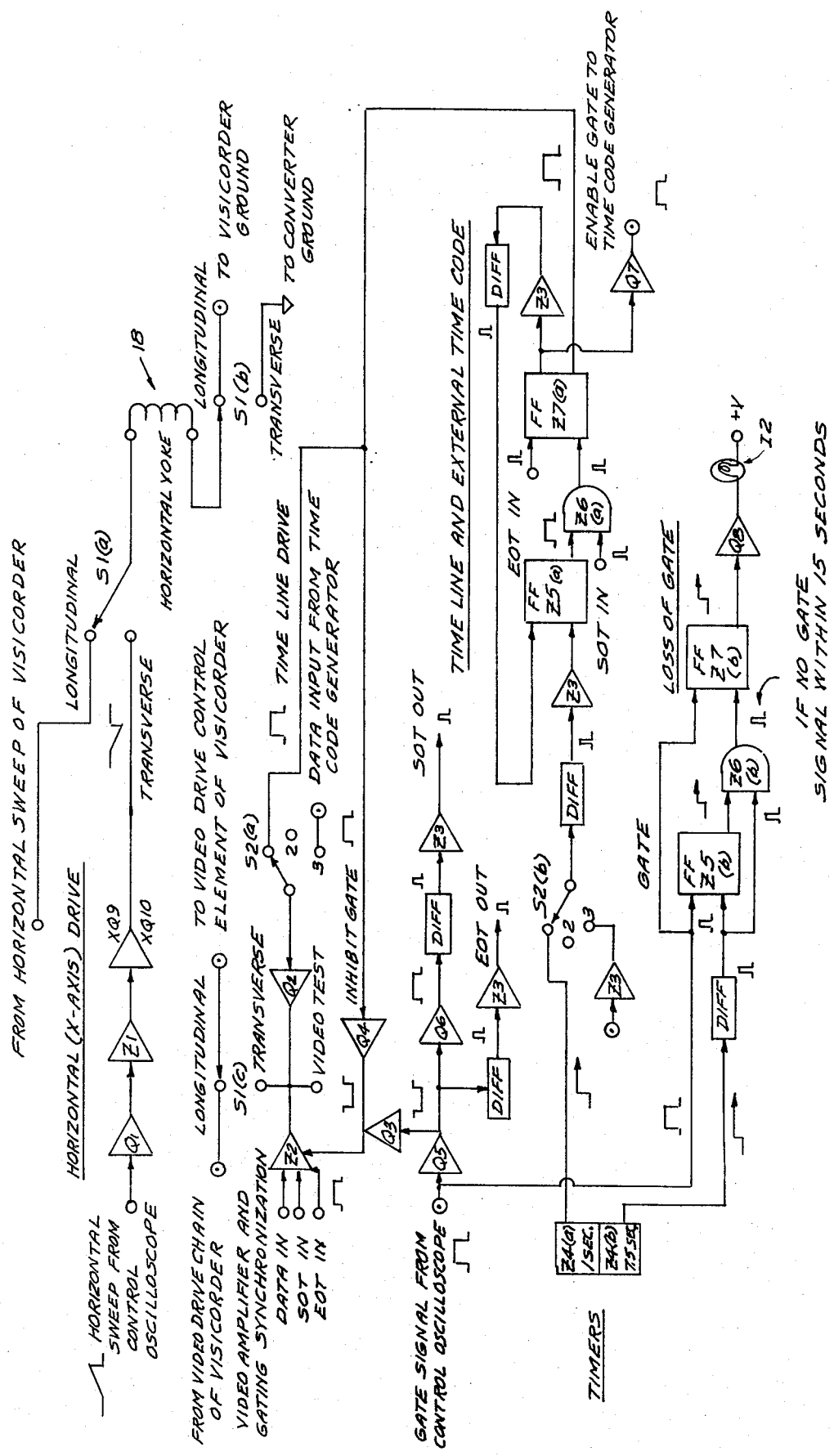
FIG. 5 is a functional block diagram of the converter, including waveform symbols at key functional elements; and, FIG. 6 is a schematic diagram of the converter.

The invention 11 includes switching circuitry to allow instant selection of either longitudinal or transverse mode operation of the visicorder 14. Specifically, when mode control switch S1 is in the longitudinal mode position, the visicorder's internally generated horizontal sweep is interconnected to the visicorder's horizontal yoke 18 and the incoming signal is directed through the visicorder's video amplifier chain to drive the cathode ray tube (see FIGS. 1, 5, and 6). In other words, switch S1 in combination with the appropriate interconnecting cables to and from the visicorder 14 permits the visicorder to operate in its normal longitudinal mode.

When S1 is switched to its transverse mode position, however, both the horizontal sweep and the video drive circuits of the visicorder are disconnected from their respective cathode ray tube control components. In lieu thereof, horizontal sweep and video drive signals generated by the invention 11 are interconnected to the yoke and internal elements of the cathode ray tube, and the visicorder can now be operated in the transverse mode.

As previously explained, the horizontal sweep rate of the control oscilloscope 13 has been adjusted by the operator to display the data to be recorded. This sample horizontal sweep signal exhibits a characteristic linear ramp, or sawtooth waveform, but is of the improper offset, slope, amplitude, and current to drive the horizontal yoke 18 of the visicorder. In short, the sample horizontal sweep signal must be conditioned and amplified to effect the desired X axis excursions of the visicorder's radiation, or video beam.

Figure 6:
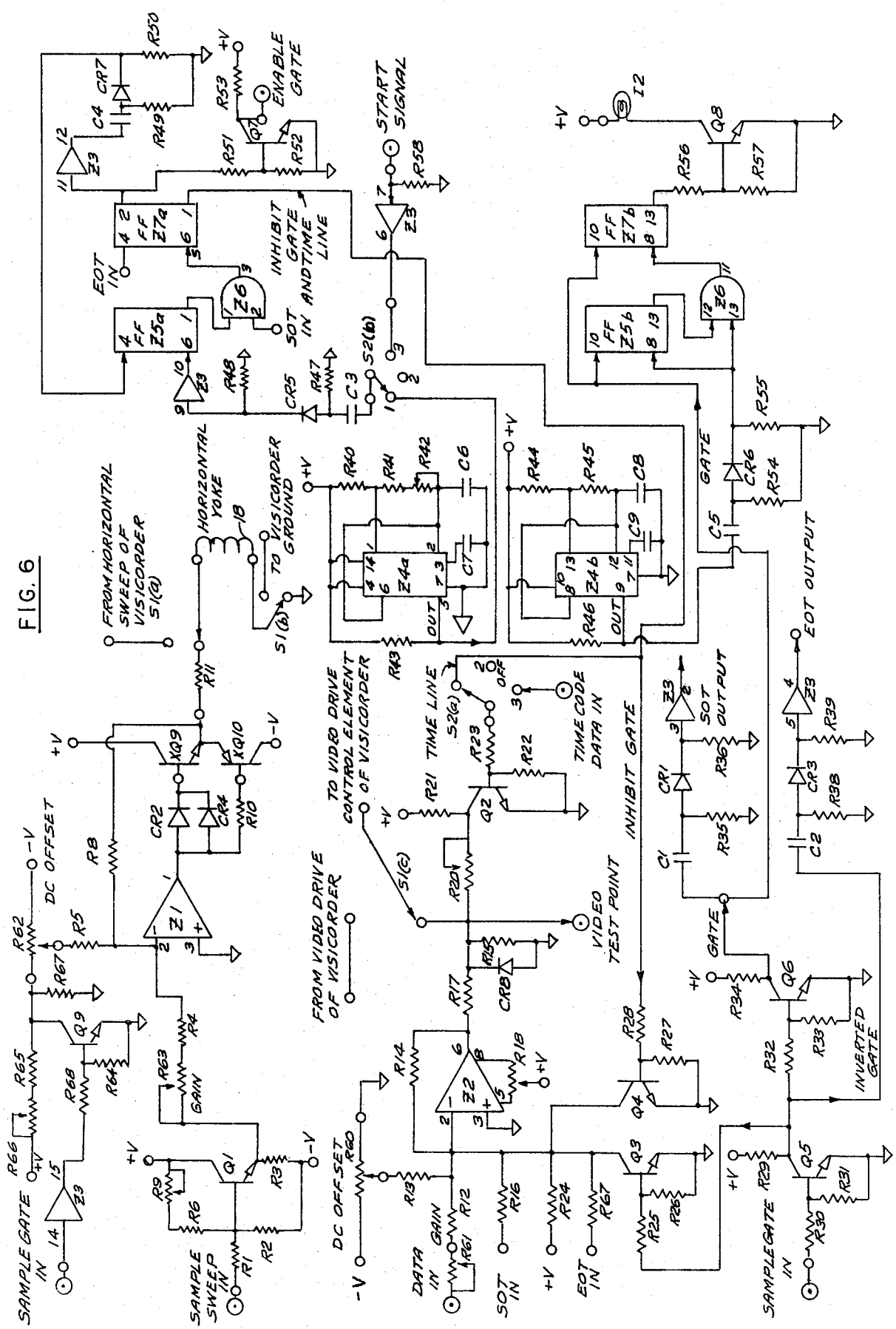

Making specific reference to FIG. 6, the sample horizontal sweep is connected to the converter 11 through R1 to the base of an emitter follower, Q1. The output of Q1 is then fed to the sweep gain potentiometer R63 through R4 to the summing junction of the inverting operational amplifier Z1. Potentiometer R62 adjusts the DC offset of the summing junction. The output of Z1 drives the crossover smoothing network CR2, CR4, and R10, connected as shown to the bases of the sweep output transistors, XQ9 and XQ10.

Since the horizontal yoke 18 must be driven with a high current, downwardly inclined ramp signal of approximately +10 to −10 volts for each left to right horizontal scan, the emitters of XQ9 and XQ10 are connected in parallel to amplify respective portions of the ramp waveform. That is to say, XQ9 amplifys the +10 volt to 0 volt portion while XQ10 amplifys the 0 volt to −10 volt portion of the waveform. The crossover smoothing network (CR2, CR4, and R10) acts to suppress the transient created when amplifying duties are shifted from XQ9 to XQ10 at approximately 0 volts.

With the switch S1 now in the transverse mode position, the horizontal yoke 18 is connected between R11 and ground. Approximately 2 peak amperes of horizontal drive current passes through the yoke, resulting in a total horizontal beam travel of six inches, from left to right, across the face of the visicorder's cathode ray tube. This extent of horizontal beam travel assures full transverse exposure of the recording medium, providing maximum X-axis resolution.

The biasing network, including R9, R6, and R2, provides a DC operating point for Q1 such that the output transistors XQ9 and XQ10 remain within their safe dissipation limits, should a loss of sweep signal occur.

Additional protection for XQ9 and XQ10 is provided by Q9, which decreases the output transistors' positive peak current during retrace of the horizontal sweep. During retrace, R65 and R67 form a voltage divider which applies a slightly positive voltage to the DC offset potentiometer R62. However, during the plus gate record period, the multi-section buffer Z3 turns on Q9, bringing the voltage divider junction to ground and placing Z1 at a normal operating point (see FIG. 4(f)).

The high frequency data signal is fed to the data input terminal, passing through video gain potentiometer R61 and R12 to the summing junction (pin 2) of a second inverting operational amplifier, Z2. Simultaneously, the gate signal from the control oscilloscope 13 is fed to the sample gate input and through R30 to the base of Q5. The leading edge of the gate pulse turns on Q5, bringing the base of Q3 low, thereby turning off Q3 for the duration of the gate pulse. The incoming data signal, inverted and amplified by Z2, is fed through R17 and S1 to the video drive control element of the cathode ray tube. The recording medium is exposed by the transversely moving video beam, intensity modulated by the transformed data signal.

A comparison of FIGS. 2 and 3 reveals the substantial advantage in resolution gained by recording high frequency data in the transverse, rather than the longitudinal mode. Adjacent pulses and groups of pulses contained in Channel 1 of FIG. 2 are so close that minute differences in data cycle characteristics are impossible to detect. However, data of similar frequency, recorded in transverse fashion as shown in FIG. 3, is easily analyzed owing to the transformation of pulse width and pulse spacing information into the expanded X axis.

Amplitude variations of the pulses are not normally recorded in transverse mode recordings of high frequency data because such variations are not generally of great interest. Appropriate adjustment of the video drive gain will, in effect, allow the X axis record to be intensity modulated in the "Z axis" in accordance with amplitude variations, if desired. It should also be mentioned that amplitude variations can easily be added to the Y axis of transverse mode recordings, as well. The vertical yoke of the visicorder would merely be interconnected to and driven by a video amplifier chain similar to that just described to produce video drive. Amplitude variations in the data then, would be amplified to drive the vertical yoke, and vertically displace the traces accordingly. However, such Y axis recording becomes increasingly difficult as the frequency of the data is raised, owing to previously mentioned bandwidth limitations of the fiber optics exposure system.

The trailing edge of the gate pulse (see FIG. 4(a)) turns off Q5, causing the base of Q3 to go high and turning Q3 on. With Q3 on, pin 2 of Z2 is grounded, providing a blanking period when no video signal is passed through Z2. The gate pulse thereby performs the dual functions of unblanking and blanking during the horizontal sweep and retrace cycles, respectively. In this manner, the data signal is conditioned and amplified into a video drive signal which is synchronized with the gate and horizontal sweep signals of the control oscilloscope 13. This ensures exacting conformity between the data displayed on the control oscilloscope and traces recorded upon the recording medium.

A portion of the inverted gate output of Q5 (see FIG. 4(c)) is delivered through R32 to the base of Q6. The reinverted output of Q6 reassumes the waveform timing of the oscilloscope's gate pulse, and is fed to the differentiating network comprising C1, R35, CR1, and R36. The leading edge of the square wave is differentiated to produce a short Start Of Trace pulse (SOT), through a section of buffer Z3. The output of Z3, in turn, is fed to the summing junction, pin 2, of Z2 through R16. At the beginning of every trace, this SOT pulse will produce a clearly visible marker at the extreme left hand boundary of the recorded trace (see FIG. 3). The diode CR1 prevents the trailing edge of the square wave from producing a similar negative pulse which could damage interconnected logic elements.

Another portion of the inverted gate output from Q5 is passed directly to the differentiating network comprising C2, R38, CR3, and R39. The trailing edge of the inverted gate pulse is differentiated in a manner identical to that just described for the reinverted gate pulse, and an End Of Trace pulse (EOT) is fed through another section of buffer Z3 to the summing junction, pin 2, of Z2. At the end of every trace, this EOT pulse marks the extreme right hand boundary of the recorded trace. The diode CR3 inhibits the production of another pulse at the leading edge of the inverted gate pulse (see FIG. 4).

While the SOT and EOT marks provide the operator with total trace width and trace placement information, additional time frame references printed in close association with the recorded data facilitate subsequent data analysis. One useful time reference is a horizontal "time line", recorded at 1 second intervals (see FIG. 3). By physically measuring the distance between adjacent time lines, an accurate determination of the recording medium's pull rate can be made. In addition, the rate of recurrent data cycles within that fixed time frame can be ascertained.

By placing switch S2 in the number 1, or "1 second time line" position, the video drive circuitry of the converter 11 is interconnected via S2(a) to a time line generator generally comprising Z4(a), flip-flop Z5(a), AND-gate Z6, and flip-flop Z7(a). Z4(a) is a timer having a cycle frequency of one second, producing repetitious pulses every second at its output (see FIG. 4(i)). S2(b) directs the square wave from Z4(a) pin 5, to the differentiator circuit C3, R47, CR5, and R48. The leading edge of the square wave is differentiated, thereby assuming a narrow pulse waveform (see FIG. 4(j)). This pulse is passed to pin 10 of the buffer Z3, setting the flip-flop Z5(a). The resultant high output of pin 1 of flip-flop Z5(a) (see FIG. 4(k)) enables the AND-gate Z6.

A sample of the SOT pulse, produced at the output pin 2 of Z3, is fed to pin 2 of Z6, causing pin 3 of Z6 to pass a pulse. This pulse sets Z7(a), and the high output at Z7(a) pin 1 (see FIG. 4(l)) creates an inhibit gate for the duration of one horizontal scan. In other words, the inhibit gate signal turns on transistor Q4, grounding the summing junction of Z2 and all incoming data. By preventing the data from entering the video drive amplifier Z2, a single scan line is available for recordation of the time line.

The output of Z7(a) pin 1 is also directed through S2(a) to the base of Q2. By switching on Q2, the video input line to S1(c) is grounded, thereby generating a dark horizontal "time line" of approximately 30 u seconds duration (see FIG. 3). At the end of this time line scan, an EOT pulse is sampled from Z3 pin 4 and fed to pin 4 of flip-flop Z7(a), thus resetting Z7(a). The data inhibit gate is thereby removed, as well as the ground across the video line, enabling data recordation to commence with the next horizontal scan.

The output from Z7(a) pin 2 is amplified by another section of the buffer Z3, and the output from Z3 pin 12 is fed to the differentiating network comprising C4, R49, CR7, and R50. The resultant pulse resets flip-flop Z5(a), disabling AND gate Z6. By leaving switch S2 in the number 1, or "time line" position, repetitive time lines will be recorded each and every second as shown in FIG. 3. Turning the switch S2 to its number 2, or "off" position, disables the time line generator, and data can be recorded without the time line interruption.

It may further be desirable to record time code data produced by an external time code generator 19 upon the recording medium 16. For example, information relating to time and date of recordation, as well as idenification of the recorded data can be encoded into pulses and recorded directly upon a single horizontal scan line. To initiate the operation, switch S2 is placed in its number 3, or "time code data in" position, interconnecting the time code generator 19 with the converter 11 (see FIG. 1). The operator actuates the time code generator 19, sending a start signal (see FIG. 4(m)) through a section of buffer Z3 and S2(b) to the differentiator circuit including C3, R47, CR5, and R48. The resultant pulse is amplified and passes from buffer Z3 pin 10 (see FIG. 4(j)) to set flip-flop Z5(a) and enable AND gate Z6. In a manner identical to that described for the time-line generation, the next SOT pulse sets Z7(a), producing a data inhibit gate for one horizontal scan.

With Z7(a) set, the output at pin 2 of Z7(a) goes low, turning Q7 off. The emitter of Q7 goes high, sending a control pulse for the duration of one scan to the time code generator. That is to say, a time code enable gate is produced which controls the time code data output of the generator 19.

The time code enable gate allows data to pass through S2(a) to Q2, thereby recording the time code upon a single horizontal scan (see FIGS. 3, 4(h), and 6). As in the time line mode of operation, Z7(a) pin 1 goes high during this period, producing an inhibit gate signal to the base of Q4 to suppress all data received at pin 2 of Z2. At the end of the scan, an EOT pulse delivered to pin 4 of flip-flop Z7(a) completes the cycle and resets Z7(a) and Z5(a) in a manner identical to that already outlined.

The converter 11 further includes a loss of gate signal indicator, generally comprising Z4(b), Z5(b), and Z7(b). Z4(b) is a repetitive timer, designated to produce a signal having a cycle frequency of approximately 7½ seconds. The output of Z4(b) is delivered to a differentiating network which includes C5, R54, CR6, and R55. The control pulse produced by the differentiator is fed to Z5(b) pin 8, setting the flip-flop Z5 and thereby placing a high output upon Z6 pin 12. Owing to the relatively slow acting flip-flop action, however, the AND-gate Z6 is not enabled sufficiently fast to allow the brief control pulse, which is also impressed upon pin 13 of Z6, to be passed during this first timer cycle. This delayed flip-flop action is desirable, of course, to prevent the loss of gate indicator from actuating as the mere result of a momentary interruption of the gate signal.

However, after 7½ seconds have passed, and the loss of gate condition has not been remedied, the next timer control pulse will pass through Z6, previously enabled by the set flip-flop Z5(b). The output pulse of Z6 sets Z7(b), causing pin 13 of Z7(b) to go high and turning on Q8. This causes current to pass through bulb I2, giving the operator a visual indication that the converter 11 is not receiving a gate signal from the control oscilloscope 13.

However, if a gate signal is received during this 7½ second period, flip-flops Z5(b) and Z7(b) are reset to prevent the next timer control pulse from setting Z7(b), thereby illuminating I2. Thereafter, the continuing gate signal will repetitively reset Z5(b) and Z7(b) at the beginning of each subsequent gate signal cycle. With this indicator feature, the operator can quickly detect a malfunction in either the control oscilloscope 13 or the interconnecting cables leading to the invention 11.

Lastly, a video test point is provided at the converter's video drive output (see S1(c) in FIG. 6). This test point provides a convenient means for previewing the actual video signal which the visicorder will record upon the recording medium (see FIG. 4(h)). The test point would normally be interconnected by a cable (see FIG. 1) to the control oscilloscope 13 for immediate viewing.

It will be appreciated, therefore, that I have provided an X/Z mode converter which allows a longitudinal mode oscillographic recorder, or visicorder, to operate selectively in either the longitudinal or transverse modes, and which can make permanent visual records of both low and high frequency data signals.

What is claimed is:

1. In a longitudinal mode oscillographic recording apparatus for continuously recording a low frequency signal by continuously drawing a radiation sensitive medium over the face of a cathode ray tube having a control element for emitting an electron beam capable of exposing the radiation sensitive medium, and including a yoke for transversely sweeping the electron beam across the radiation sensitive medium in response to the output of a horizontal sweep generator triggered by the low frequency signal, and further including a video drive chain responsive to the low frequency signal for driving the control element, the improvement comprising:

a. means for producing a gating signal and a synchronous horizontal sweep signal, in response to a high frequency signal;

b. a transverse mode converter including:
  (1) synchronization means interconnected to the high frequency signal and to said gating signal for producing a synchronized signal corresponding to the portion of the high frequency signal to be recorded;
  (2) first amplifying means for amplifying said synchronized signal to produce a video drive signal;
  (3) second amplifier means for amplifying said horizontal sweep signal;
  (4) mode control means, operative in a first longitudinal mode position to interconnect the video drive chain with the control element and to interconnect the horizontal sweep generator with the yoke for longitudinally recording the low frequency signal; and said mode control means being operative in a second transverse mode position alternatively to interconnect the output of said first amplifier means with the control element and to interconnect the output of said second amplifier means with the yoke for transversely recording the high frequency signal.

2. An apparatus for selectively recording upon a longitudinally drawn radiation sensitive medium a visual representation of a low frequency signal in a first longitudinal mode and a high frequency signal in a second transverse mode, said apparatus comprising:

a. a control oscilloscope interconnected to the high frequency signal, said control oscilloscope including a horizontal sweep control adjusted to provide a visual representation of the high frequency signal, said control oscilloscope further including a sample output for the gating signal and a sample output for the horizontal sweep signal;

b. a longitudinal mode oscillographic recording apparatus for continuously recording a signal, said recording apparatus including:
  (1) means for continually drawing the radiation sensitive medium longitudinally over the face of a cathode ray tube having a control element for emitting an electron beam capable of exposing the radiation sensitive medium;
  (2) yoke means for transversely sweeping said electron beam across the radiation sensitive medium;
  (3) an internal horizontal sweep generator triggered by the low frequency signal;
  (4) an internal video drive chain, responsive to the low frequency signal;

c. a transverse mode converter including:
  (1) synchronization means interconnected to the high frequency signal and to said sample output of said gating signal, for producing a synchronized signal corresponding to said visual representation provided by said control oscilloscope;
  (2) first amplifying means for amplifying said synchronized signal to produce a video drive signal;
  (3) second amplifier means for amplifying said horizontal sweep signal;
  (4) mode control means, operative in a first longitudinal mode position to interconnect said internal video drive chain with said control element and to interconnect said internal horizontal sweep generator with said yoke means for longitudinally recording the low frequency signal; and said mode control means being operative in a second transverse mode position to disconnect said internal video drive chain and said internal horizontal sweep generator, and to interconnect the output of said first amplifier means with said control element and to interconnect the output of said second amplifier means with said yoke means for transversely recording the high frequency signal.

3. An apparatus as in claim 2 including means for recording a start of trace marker at the beginning of each transverse sweep of said electron beam.

4. An apparatus as in claim 3 wherein said means for recording a start of trace marker comprises: transistor means responsive to said gating signal for producing a square wave output in accordance therewith; first differentiating means interconnected to the output of said transistor means for producing a start of trace pulse coincident with the leading edge of each square wave; and first buffer means interposed between the output of said first differentiating means and the input to said first amplifier means, producing a video drive signal commensurate with said start of trace pulse.

5. An apparatus as in claim 2 including means for recording an end of trace marker at the end of each transverse sweep of said electron beam.

6. An apparatus as in claim 5 wherein said means for recording an end of trace marker comprises: inverting transistor means responsive to said gating signal for producing a square wave output in inverted relationship therewith; second differentiating means interconnected to the output of said inverting transistor means for producing an end of trace pulse coincident with the trailing edge of each inverted square wave; and second buffer means interposed between the output of said second differentiating means and the input to said first amplifier means, producing a video drive signal commensurate with said end of trace pulse.

7. An apparatus as in claim 2 having means for selectively recording vertically spaced, transverse time lines across the radiation sensitive medium at predetermined intervals.

8. An apparatus as in claim 7 wherein said time line recording means includes: timer means for producing repetitious square wave pulses of predetermined duration; third differentiating means; first switching means for selectively interconnecting in a first position said timer means with said third differentiating means for producing a first control pulse coincident with the leading edge of each of said repetitious square wave pulses; first flip-flop means; third buffer means interposed between the output of said third differentiating means and the set input of said first flip-flop means for setting said first flip-flop means in response to a said first control pulse; AND-gate means having a first input connected to the set output of said first flip-flop means and a second input connected to the output of said first buffer means; a second flip-flop means having a reset input connected to the output of said second buffer and a set input connected to the output of said AND-gate means;

a fourth differentiating means interposed between the reset output of said second flip-flop means and the reset input of said first flip-flop means; and inhibit gate means responsive to the set output of said second flip-flop means for grounding the input of said first amplifier means and grounding the output of said first amplifier means, whereby said first control pulse sets said first flip-flop means, enabling said AND-gate so that said start of trace pulse sets said second flip-flop means, producing an inhibit gate suppressing any high frequency signal and recording a time line trace during one horizontal sweep of said electron beam, and said end of trace pulse thus resetting said second flip-flop means, thereby removing the grounding circuits across the input and output of said first amplifier means and resetting said first flip-flop means.

9. An apparatus as in claim 2 having means for selectively recording an external time code transversely across the radiation sensitive medium.

10. An apparatus as in claim 9 wherein said external time code recording means includes: start signal means interconnected to said third differentiator means when said first switching means is in a second position, for producing a second control pulse coincident with the leading edge of the start signal; a time code generator; enable gate means, interposed between said time code generator and said reset output of said second flip-flop, for actuating said time code generator; second switching means for disconnecting said inhibit gate means from said output of said first amplifier means and interconnecting the output of said time code generator with said output of said first amplifier means, whereby said second control pulse sets said first flip-flop means, enabling said AND-gate so that said start of trace pulse sets said second flip-flop means, producing an inhibit gate suppressing any high frequency signal, and activating said time code generator thereby recording the time code generator output during one horizontal sweep of said electron beam, said end of trace pulse thus resetting said second flip-flop means, thereby removing the grounding circuit across the input of said first amplifier means and resetting said first flip-flop means.

11. An apparatus as in claim 1 or 2 including means for vertically deflecting said electron beam in response to amplitude variations of the high frequency signal.

12. An apparatus as in claim 2 including means for indicating a loss of said gating signal.

* * * * *